United States Patent [19]
Bickford et al.

[11] Patent Number: 5,399,902
[45] Date of Patent: Mar. 21, 1995

[54] SEMICONDUCTOR CHIP PACKAGING STRUCTURE INCLUDING A GROUND PLANE

[75] Inventors: Harry R. Bickford, Ossining; Paul W. Coteus, Yorktown Heights; Linda C. Matthew, Peekskill, all of N.Y.

[73] Assignee: International Business Machines Corporation, Armonk, N.Y.

[21] Appl. No.: 26,427

[22] Filed: Mar. 4, 1993

[51] Int. Cl.$^6$ ............... H01L 49/00; H01L 23/48; H01L 27/04; H01L 29/44
[52] U.S. Cl. ............... 257/659; 257/758; 257/774; 257/508; 257/691; 174/35 R; 361/816
[58] Field of Search ............ 257/659, 758, 774, 691, 257/700, 488, 503, 508; 174/35 R; 361/816

[56] References Cited

U.S. PATENT DOCUMENTS

| | | | |
|---|---|---|---|
| 3,409,807 | 11/1968 | Gerstner | 257/659 |
| 4,255,900 | 9/1980 | Ciccio et al. | 361/395 |
| 4,496,793 | 1/1985 | Hanson et al. | 174/685 |
| 4,654,248 | 3/1987 | Mohammed | 428/137 |
| 4,796,078 | 1/1989 | Phelps, Jr. et al. | 257/660 |
| 4,862,245 | 8/1989 | Pashby et al. | 257/678 |
| 4,936,646 | 6/1990 | Enochs et al. | 350/96.20 |
| 5,014,113 | 5/1991 | Casto | 257/678 |
| 5,041,901 | 8/1991 | Kitano et al. | 257/678 |
| 5,047,834 | 9/1991 | Kovac et al. | 257/678 |
| 5,055,914 | 10/1991 | Shimizu et al. | 357/81 |
| 5,089,876 | 2/1992 | Ishioka | 257/659 |
| 5,166,772 | 11/1992 | Soldner et al. | 257/659 |

FOREIGN PATENT DOCUMENTS

| | | | |
|---|---|---|---|
| 421343 | 4/1991 | European Pat. Off. | 257/659 |
| 58-122776 | 7/1983 | Japan | 257/659 |
| 1278052 | 11/1989 | Japan | 257/659 |
| 2125643 | 5/1990 | Japan | 257/659 |
| 2209735 | 8/1990 | Japan | 257/659 |

OTHER PUBLICATIONS

H. R. Bickford et al. "Dual Metal Thickness Tape Automated Bonding Leadframe", IBM Tech Discl. Bull, vol. 32, No. 3A, Aug. 1989, p. 85.

*Primary Examiner*—Andrew J. James
*Assistant Examiner*—T. M. Arroyo
*Attorney, Agent, or Firm*—Daniel P. Morris; Alvin J. Riddles

[57] ABSTRACT

A semiconductor chip package wherein the chip is a major contributor to the strength of the package. External contacts and wiring are provided by a multilayer wiring member that has a mesh ground plane with embedded power bus layer over a conductor layer for expansion mismatch control and impedance control, a protective encapsulation covers the bonds from the wiring conductors to the chip, and external contact connections employ fused metal through the contact members.

18 Claims, 7 Drawing Sheets

SEMICONDUCTOR CHIP PACKAGING STRUCTURE INCLUDING A GROUND PLANE

FIELD OF THE INVENTION

The invention is in the field of packaging semiconductor chips in structures that provide both an interface to external wiring and encapsulation from contaminants.

BACKGROUND OF THE INVENTION AND RELATION TO THE PRIOR ART

In electronic apparatus, as progress in downsizing, or the making of the overall apparatus smaller, continues the considerations that must be met in the package for the semiconductor chip become greater. The package must not only support the chip and protect from deleterious environmental contaminants but it must also maintain reliable and easily attachable connections to external circuitry through ever widening temperature cycling as the number of devices in the chip increase. The increasing of the density in the chip results in smaller and more closely spaced pads and in turn more fragile conductor connections result.

A current chip packaging technique employs a lead frame type structure of dielectric supported conductors with close spacing at a central aperture and more relaxed spacing at external connectors around the periphery. The chip is fastened to the lead frame at the central aperture and delicate leads are employed to join the close spaced lead frame conductors to the pads on the chip. The chip and the lead frame are encapsulated in a dielectric body. Such a packaging structure is described in U.S. Pat. No. 4,862,245.

As more stringent performance specifications are encountered, a need is developing for a package that reduces the effects of mechanical stresses from material mismatches, that reduces damage to the fragile leads joining the chip pads to the package wiring, that maintains optimum electrical signal transmission properties closer to the pads and with a minimal increase in overall dimensions after encapsulation.

SUMMARY OF THE INVENTION

A semiconductor chip package wherein the chip is a major contributor to the strength of the encapsulation structure, the external contacts to the package and the chip wiring are provided through a multilayer wiring member wherein broad metal areas are of mesh configuration and the electrical transmission properties of the package employ at least portions of one of the multilayer wiring member layers as a ground plane, the bonds to the chip pads are connected to the layer of the multilayer wiring member that is adjacent to the chip surface, there is a separate protective encapsulation region for the bonds between the wiring and the chip pads extending from the chip surface to the top of the multilayer wiring member and covering portions of the encapsulation structure encloses all but the external wiring contacts.

The package provides: the electrical advantages of selectable ground and power referencing of short wiring lines without crossovers and increased external wiring pad connecting flexibility and reliability; and the mechanical advantages of the availability of mesh metal expansion control in thermal stress condition areas, bonds at the level adjacent to the chip surface for protection and for the structural feature of an independent bond encapsulation region, covering portion molding support and the chip itself contributing to the physical strength of the package. The package structure has an overall height only slightly greater than that of the chip itself.

DESCRIPTION OF THE INVENTION

The invention involves semiconductor chip packaging technology wherein the chip is a major contributor to the encapsulation structure, the external contacts to the package and wiring serving the chip are provided through a multilayer wiring member, the bonds to the chip pads are connected to the layer of the multilayer wiring member that is adjacent to the chip surface, and there is a separate protective encapsulation region for the bonds.

Figure 1:
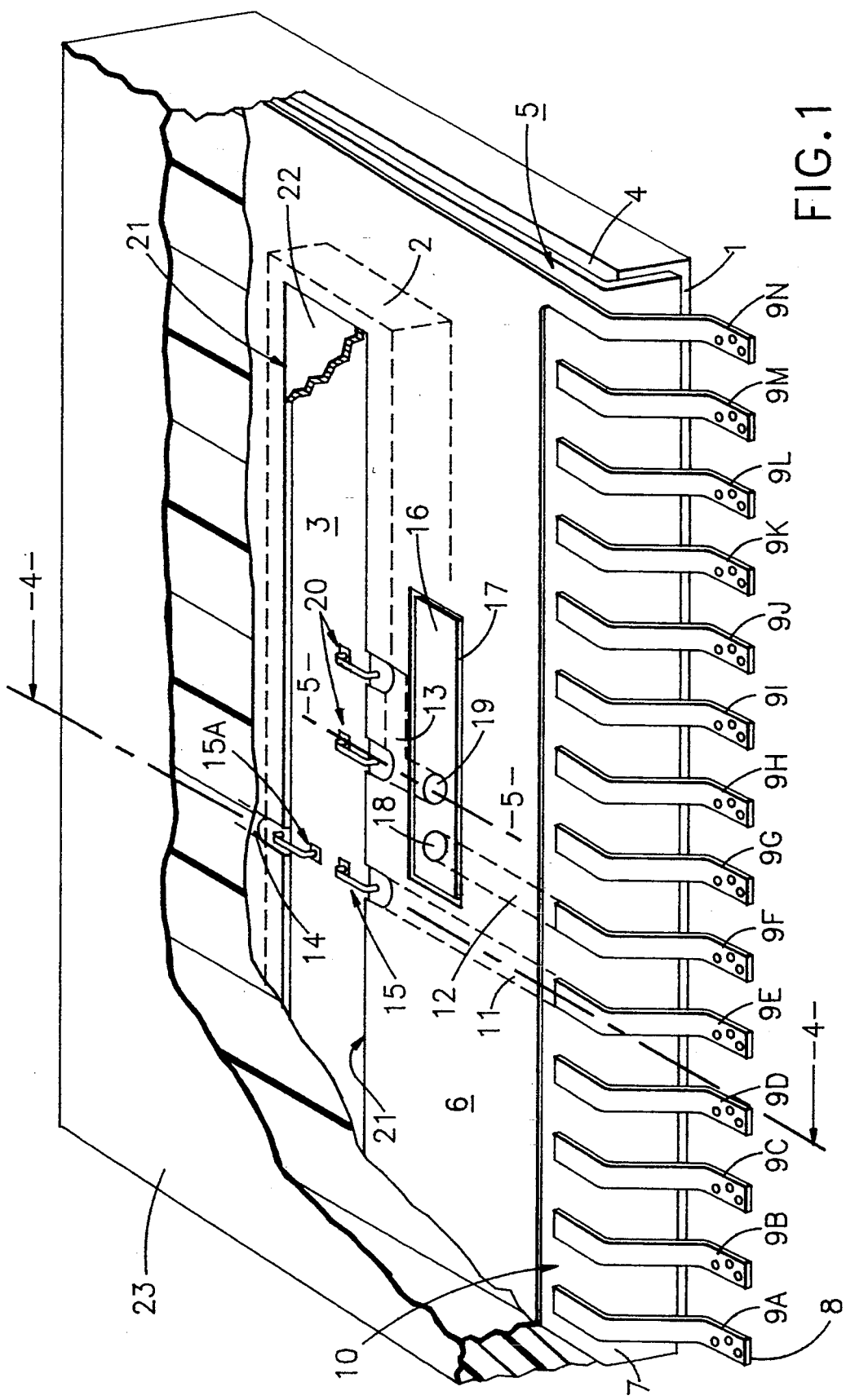
FIG. 1 is a schematic perspective representation of one embodiment of the invention. Parts of the top encapsulation and a portion of the bond encapsulation have been broken away to show the relative interrelationship of the chip, the multilayer wiring member, the bonds and power distribution and base and covering encapsulation.

Referring to FIG. 1, a schematic perspective representation of one embodiment of the invention is shown in which on a base portion 1 of a dielectric, such as an injection moldable epoxy resin, a chip 2 is positioned with the device pad containing surface 3 thereof essentially even with the upper surface of the base 1.

The wiring serving the chip 2 is provided in a multilayer wiring member 5 positioned on the base 1. The multilayer wiring member. 5, shown in detail in FIG. 2 following, has, visible in this perspective, a broad area metal layer 6, a dielectric core member 7 thereunder and a wiring layer 8 adjacent to the upper surface 4 of the base 1, only the edge portion of the layer 8 on the underside of the bottom of the external contacts 9A to 9N being visible in this view. The holes in the external contact portion of the element 9A–9N facilitate metal flow as described in FIGS. 9 to 22.

There are, at this point in the art, two general types of chips; those with contact pads in an area in the central portion of the chip and those with the contact pads along the periphery of the chip. There are also special chips with contact pads located randomly in the surface. For continuity and clarity, the embodiment described is for the type of chip with the contact pads located in the central area, although in the light of the packaging principles of the invention set forth herein, it will be apparent to one skilled in the art that those principles will be applicable to packaging with other types of chip contact pad locations.

Figure 2:
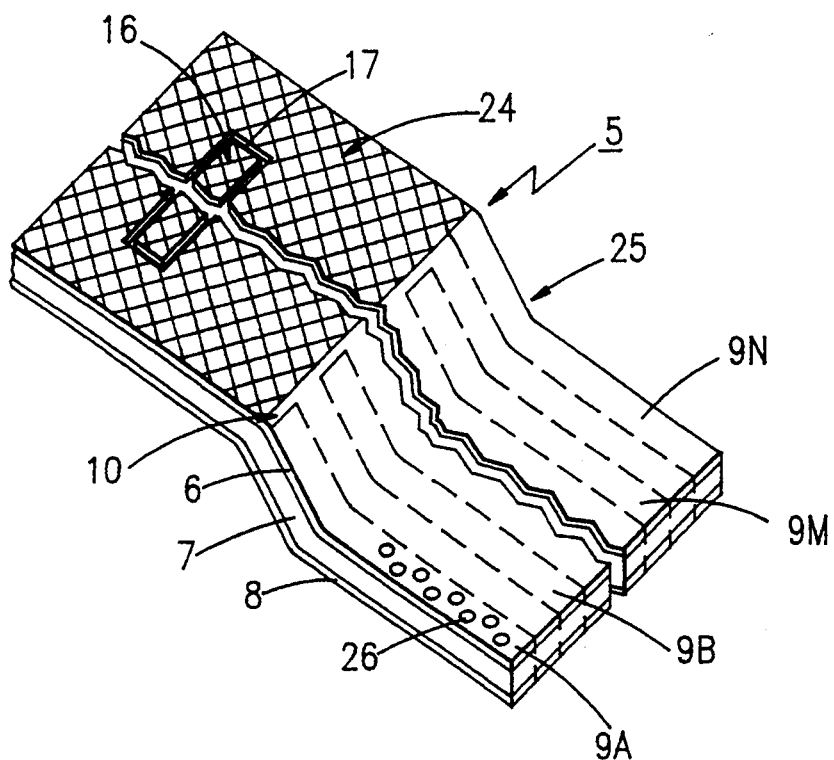
FIG. 2 is a schematic perspective representation of one embodiment of the multilayer wiring member of the invention.

Continuing to refer to FIG. 1, in this embodiment the layer 6 of the multilayer wiring member 5 is selected for the broad area metal involving ground plane and power bus type features and the layer 8 is selected for power and signal wiring. In this arrangement, the external contact 9N would remain connected to the layer 6 and all others, 9A–9M, would be disconnected from layer 6 by separating in an area 10 such as by etching or selective plating in manufacture leaving exposed a portion of the dielectric core 7. The layer 8, to serve as wiring, is selectively fabricated to provide conductors 11–14, shown dotted. To accommodate expansion mismatch between metal, the various dielectric materials, and the crystal chip, the broad area of metal in the layer 6 is made in the form of a mesh of fine conductor paths separated by open areas. This feature is illustrated in FIG. 2. It could not be shown in FIG. 1 and still illustrate other features. The mesh retains the low resistance and ground plane proximity advantages while accommodating expansion mismatch stresses. It can be formed by selective plating or pattern etching.

Example power and signal wiring conductors formed in manufacturing from layer 8 is shown dotted as conductor examples 11–14. Conductor 11 connects external contact 9E to bond location 15 and conductor 14 on the other side of the pad containing surface 3 of the chip 2 connects bond location 15A to an external contact, not shown, on the opposite side. There are very short signal wiring paths in the packaging technology of the invention. Each of example signal conductors 11 and 14, along its entire length, is separated a uniform distance, the thickness of the dielectric core layer 7, from the ground plane 6. An example power bus 16 is embedded in the ground plane 6 by forming a separation 17, as by etching or selective deposition, in the mesh of the ground plane 6. The power bus 16 is connected to external contact 9F by conductor 12 on the underside of dielectric core layer 7 and via 18 through the dielectric core layer 7. The power bus 16 is connected to conductor 13 on the underside of dielectric core layer 7 through via 19. The power conductor 13 branches to locations 20 for bonding to power pads on the surface 3 of the chip 2.

The bonds from the wiring to the pads on the chip are very fragile. A feature of the packaging technology of the invention is that the bonds can all be made from a wiring level adjacent to the chip surface 3 which in turn provides protection of the bond to the wiring by the multilayer wiring member 5 surrounding the bonding contact point, the height of every bond being essentially protected by being less than the height of the multilayer wiring member 5, with no bond crossing over another and by the combination of the edge configuration 21 of the multilayer wiring member 5 and the surface 3 of the chip 2 providing a mold for a bond protecting encapsulant material, such as an epoxy, a portion of which is shown in FIG. 1 as element 22, shown filling the opening in the multilayer wiring member 5.

To clarify description of the interdependence in function and features of the individual elements involved in the principles of the invention, parts are employed in the embodiment illustrated that may be eliminated or combined in other embodiments. For example, the illustrated encapsulation, employing a support such as a base 1 with a bond protecting encapsulant 22 and cover 23 may be arranged so that the chip 2 is supported by being adhesively attached to the multilayer wiring member. 5 around the edge 21 with the functions of the bond protecting encapsulant 22 and the cover 23 combined in a single encapsulant member. Such an embodiment leaves the bottom of the chip 2 free for heat sinking and permits the adhesive attachment members, 27 beneath and 28 optional above, both visible in FIG. 4, to contribute to a damming function in the molding of the covering encapsulant member to prevent the encapsulant material from escaping around the external conductor members 9.

There are several types of bonds employed in the art. Any type bond that meets the allowable process window specifications would be suitable. In this embodiment, standard wire bonding is employed. Thermocompression bonding is considered suitable. The detailed features of the bonds are further shown in connection with FIGS. 4 and 5.

Further, continuing to refer to FIG. 1, the package is completed by applying a covering portion 23 of an injection moldable resin, such as epoxy, over the base 1 and multilayer wiring member 5. A feature of the packaging technology of the invention is that the chip 2 itself becomes part of the mechanical strength of the package which permits substantial reduction in overall package thickness. The thickness of the base 1 under the chip 2 and the covering portion 23 over the chip 2 and multilayer wiring member 5 is about half the chip thickness so that the overall package height is about twice the chip thickness. In an embodiment where only the chip 2 adhesively attached to the multilayer wiring member is involved, the overall package height would be much less.

Referring to FIG. 2, there is shown a schematic perspective representation, using the same reference numerals for like elements as in FIG. 1, of one embodiment of the multilayer wiring member 5 of the invention.

The multilayer wiring member 5 has the combined general features of: facilitating simplicity and reliability in the terminations of the wiring, both where the wiring is bonded to the chip and to the external wiring connections, and providing a mesh configuration of metal 24 in any broad area of metal, which mesh 24 retains acceptable electrical resistance properties and accommodates stress from any expansion mismatch.

The multilayer wiring member 5 is made up of layers of metal 6 and 8 for electrical purposes, separated by a dielectric core layer 7 of a plastic material to which can be imparted some adhesive properties such as a polyimide. The relative thickness dimensions of the metal layers 6 and 8 and choice of dielectric for the core are selected so as to permit flexibility of the multilayer wiring member for simple formation in the region 25 of the gull wing external contact 9A-9N shapes and to permit acceptable electrical transmission line impedance properties for the wiring formed out of the metal layers. Thicknesses in the 25 to 50 micron range for the layers 6, 7 and 8 is usually satisfactory. The multilayer wiring member 5 has at least one wiring metal layer 8 and at least one broad area metal layer 6, all metal layers separated by a dielectric layer 7. When wiring conductors and external contacts 9 are formed from the metal layers, the dielectric core 7 provides planarity to the wiring members and permits closer pitch. On external contacts 9, the size and pitch is usually governed by standardized dimensions employed in the external wiring product to which the package of the invention is to be attached. Increased reliability is achieved through providing holes 26 through the contacts 9 that permit a bonding metal such as solder to flow, usually by capillary action, to join all metal layers in attachment. The external contacts 9, their formation and attachment is discussed in greater detail following in connection with FIGS. 9 to 22.

The formation of the wiring conductors from the metal layer 8 and the mesh and other features of layer 6 may be accomplished by patterned etching or erosion operations followed by plating on the remaining metal where added metal is needed for electrical conduction or connection. The conductors and the mesh conductor widths are such that they can be fabricated together. The formation of the mesh in the metal in region 24 is accomplished by pattern plating a pattern of generally checkerboard open spaces followed by a plating on the remaining metal where added metal is needed for electrical conduction or connection purposes.

At this point in the art, there are three general configuration techniques in metallization. They are: the fully subtractive, involving etching or erosion of a full metal layer; the fully additive, involving patterned plating; and a combination involving plating followed by erosion. All may be used and all may be sometimes followed by a personalization metallization operation depositing a desired surface metal.

The formation of the contacts 9 with holes 26 is accomplished by the operation of plating followed by erosion of the dielectric 7. The formation of electrical continuity disruption features, such as in FIGS. 1 and 2, the area 10 of separation of contacts 9 from the broad area, mesh 24 in FIG. 2, of metal layer 6, and the separation 17 in the metal layer 6 in FIGS. 1 and 2 that separates the power bus 16 from the rest of the mesh 24, may be accomplished by pattern plating or by pattern etching. Vias, such as 18 and 19 of FIG. 1, may be provided by hole formation as by drilling or punching, followed by filling the hole with a metal, such as solder or plating through holes in fabrication using standard via techniques in the art.

The multilayer wiring member 5 is an object similar to the flex tape conductor member employed in apparatus wiring in the art, In applications where wiring transmission line performance is not rigorous, the mesh structure may be eliminated.

The multilayer wiring member 5 of the invention may be fabricated as a separate intermediate manufacturing product with the mesh 24 continued to the external contacts 9 and wiring conductor formation and continuity disruption features being applied as personalization operations in assembly.

Figure 3A:
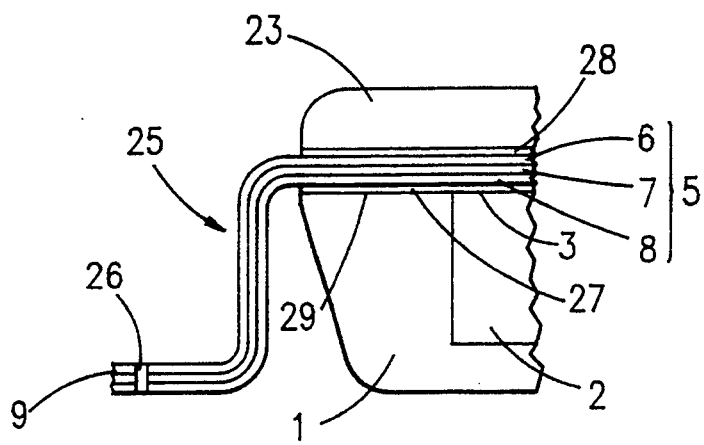
FIG. 3A is a schematic representation of a partial cross section of one embodiment of the package of the invention showing the relative positioning of the multilayer wiring member, the chip and the base and covering encapsulation.

Referring next to FIG. 3A, not correlated with any other Figure, a schematic representation of a partial cross section of the package of the invention in the embodiment of FIG. 1 is provided using the same reference numerals as in FIGS. 1 and 2 for like elements showing the relative positioning of the elements. A portion of the base 1 is shown in which the chip 2 is positioned with the contact face 3 of the chip essentially flush with the surface 29 of the base 1. A layer 27 of an adhesive dielectric is placed across the intersection between the surface 3 of the chip 2 and the surface 29 of the base 1. The multilayer wiring element 5 with metal layers 6 and 8 separated by dielectric core layer 7 is positioned on the adhesive dielectric layer 27. The multilayer wiring member 5 in the region 25 is shaped in the gull wing configuration employed in the art where the external contact 9 portion is brought to the general level of the bottom of the base 1. Since the multilayer wiring element 5 in this embodiment is thin and flexible somewhat resembling the flex tape used in the art, the shaping can usually be done manually. In the attaching of the external contact 9 to the pad, not shown, of the external wiring member, the solder or other low temperature flow material extends through the hole 26 so that a more reliable fused contact is made with all metal layers.

A feature of the package of the invention is that the overall dimension, of the package from the bottom of the base 1 to the top of the cover 23 is only about twice the thickness of the chip 2. In embodiments where base 1 and cover 23 are not used, the height is even less. The crystal chip 2 is a major contributor in the mechanical strength of the package, particularly in an embodiment where the base 1 and cover 23 are not used. The reduced mass of the package and the thinness of the base 1 and cover 23 enhance transfer of heat from the chip 2 to the ambient or heat sinking as used in service.

Figure 3B:
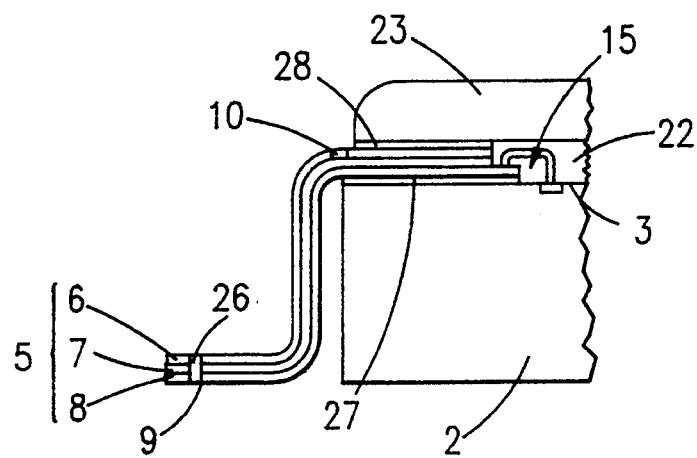
FIG. 3B is a schematic representation of a partial cross section of another embodiment of the package of the invention showing the relative positioning of the multilayer wiring member, the bond and covering encapsulation and with the bottom of the chip exposed for heat sinking.

Referring next to FIG. 3B, not correlated with any other Figure, a schematic representation of a partial cross section of the package is shown in the embodiment where the bottom of the chip is exposed for heat sinking. The same reference numerals as in previous Figures are used. The multilayer wiring member 5 is adhesively attached to the surface 3 of the chip 2 with adhesive layer 27. The bottom of the chip 2 is left exposed. The bond from the conductor layer 8 to the pad in the chip surface 3 at location 15 is surrounded by bond protecting encapsulant 22. A layer 28 over the broad area metal mesh layer 6 melds with the cover 23 and prevents the cover 23 from squeezing between the external contact members 9 during the molding operation of the cover 23. In the FIG. 3B, the layer 28 does not extend over the element 22. Where specifications will permit, the elements 22, 23 and 28 can be a single element.

Figure 4:
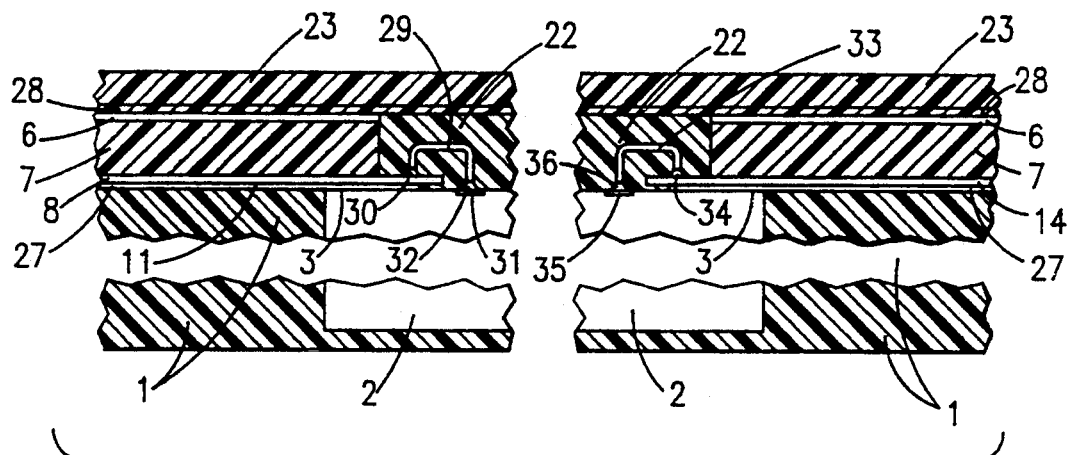
FIG. 4 is a schematic partial cross section along the line -4—4- of FIG. 1 of the wiring bonding region showing the signal type conductors, the bond region encapsulation and the base and covering encapsulation portions.

Referring next to FIG. 4, a schematic partial cross section along the lines -4—4- of FIG. 1 is provided of the portion of the package of the invention illustrating the bonds from the wiring to the pads on the chip. In FIG. 4, the same reference numerals for like elements are used as in FIGS. 1, 2, 3A and 3B. In FIG. 4, the bonding connections for signal conductors and the protective encapsulation for the wiring to chip bonds is illustrated. Major features of the invention are that all bonds are made from the pads on the chip surface to a conductor adjacent to the chip surface without crossover or extending substantially above the multilayer wiring member and that the multilayer wiring member protects the bonds and serves as part of a mold for a bond protecting encapsulation. In FIG. 4, the signal conductors 11 and 14 of FIG. 1 formed from layer 8 of the multilayer wiring member 5 is adjacent the surface 3 of the chip 2 and the wire bond members 29 and 33 fused at locations 30 and 34 go to the pads 31 and 35 at locations 32 and 36, respectively, remaining below the level of the upper layer 6 of the multilayer wiring member 5. Under these conditions, all bonds are essentially lower or even with the upper layer 6 of the multilayer wiring member 5 and the region bounded by the edge configuration 21 of FIG. 1 of the multilayer wiring member and the surface 3 of the chip 2 can be filled with a bond protecting encapsulant 22, such as an epoxy type plastic. In principle, the package is complete at this point, for the embodiment involving the base and the cover.

Figure 5:
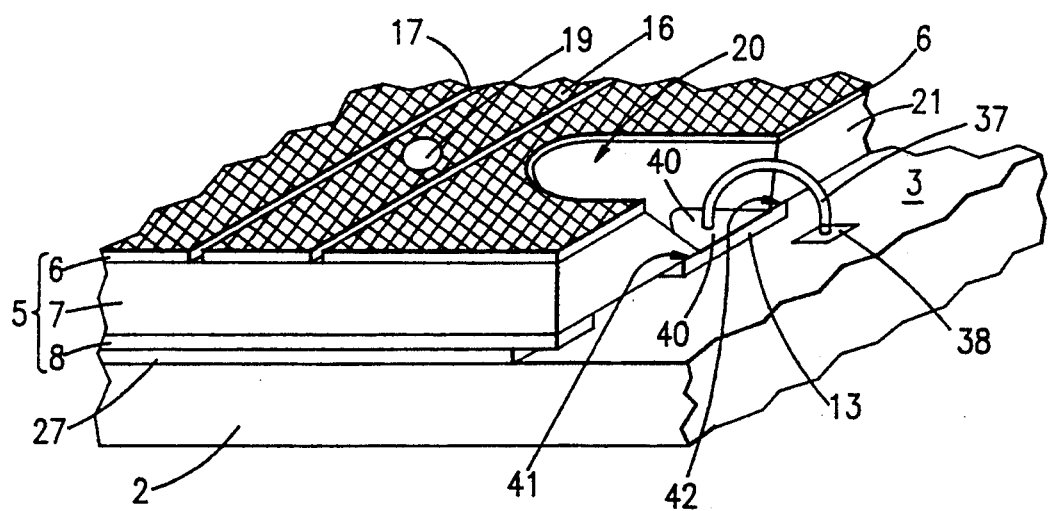
FIG. 5 is a schematic perspective representation along the line -5—5- of FIG. 1, of the chip and the multilayer wiring member illustrating the power conductors and bus, the protection by the core dielectric of a bond joining a power conductor and a pad on the chip surface.

Referring next to FIG. 5, a schematic perspective representation is provided along the lines 5—5 of FIG. 1 of the chip 2 and the multilayer wiring member 5 illustrating the power conductor bonds and the protection provided by the core dielectric 7 of a bond 37 joining a power conductor such as 13 in FIG. 1 and a pad 38 in the face 3 of the chip 2. In the perspective representation of FIG. 5, the base 1, the adhesive 28 and the covering 23 are not shown. The power conductor 13 from location 20 extends to via 19 which connects it to the power bus 16 within the separation 17.

A feature of the invention is the protection provided the fragile bonds that join the wiring conductors to the pads on the chip. At a bonding location, such as 20 in FIG. 1, the broad area mesh metal layer 6 is locally shaped to define the edge 39 of the core dielectric 7 by erosion of the dielectric to expose the bonding location 40 on the conductor 13. The core dielectric 7 cutback is controlled so that the core dielectric 7 overlaps each edge of the wiring conductor 13 at locations 41 and 42, thereby providing a protective surrounding location for the bond and a seal at the conductor 13 when the bond protecting plastic 22 of FIGS. 1 and 4, that is not shown in this Figure, is applied after the bonds joining the wiring to the pads in the face 3 of the chip 2 are in position. The cutting back of the core dielectric 7 around the bond location 20 is achieved with standard erosion techniques.

Figure 6:
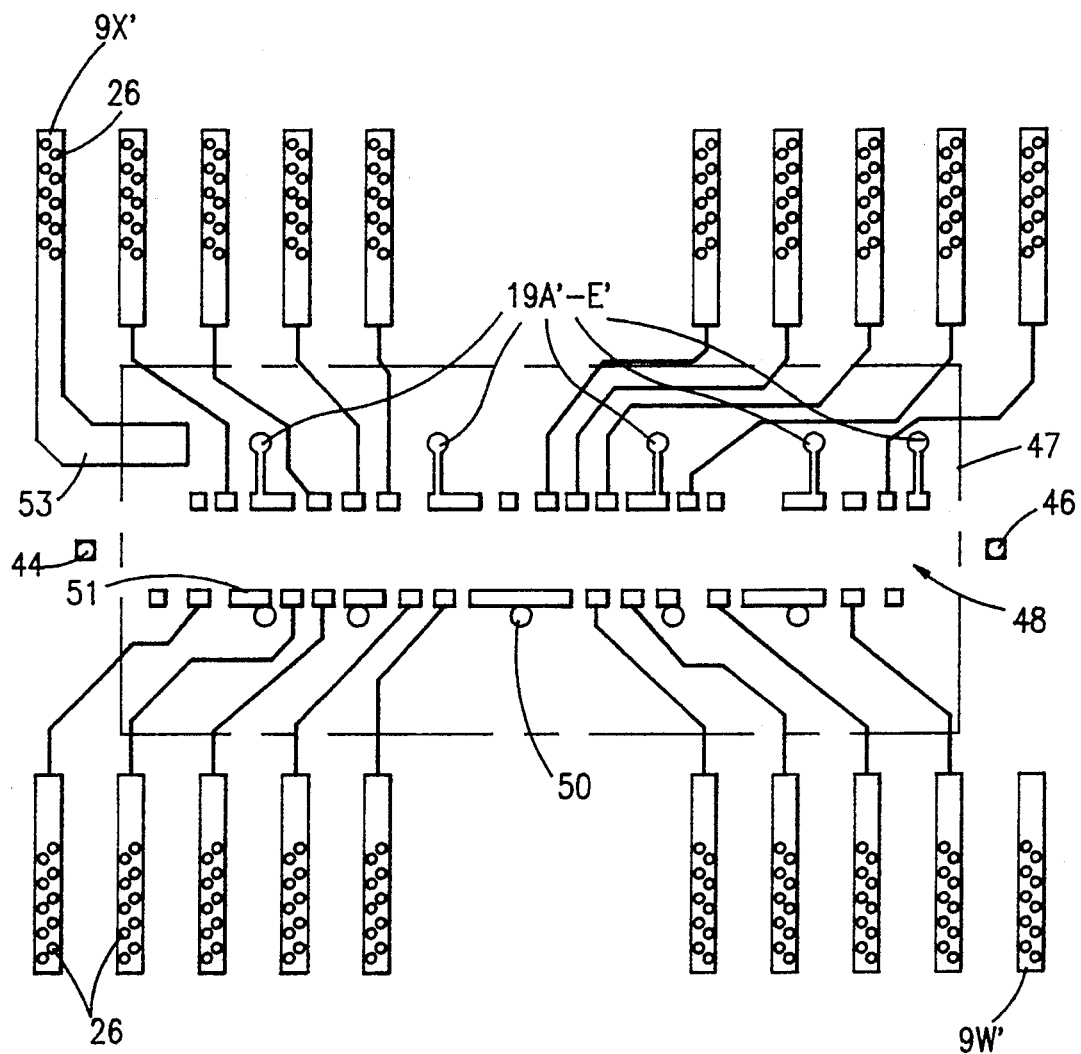
FIG. 6 is a schematic representation of the signal wiring pattern on the signal layer of the multilayer wiring member in one embodiment of the invention.
Figure 7:
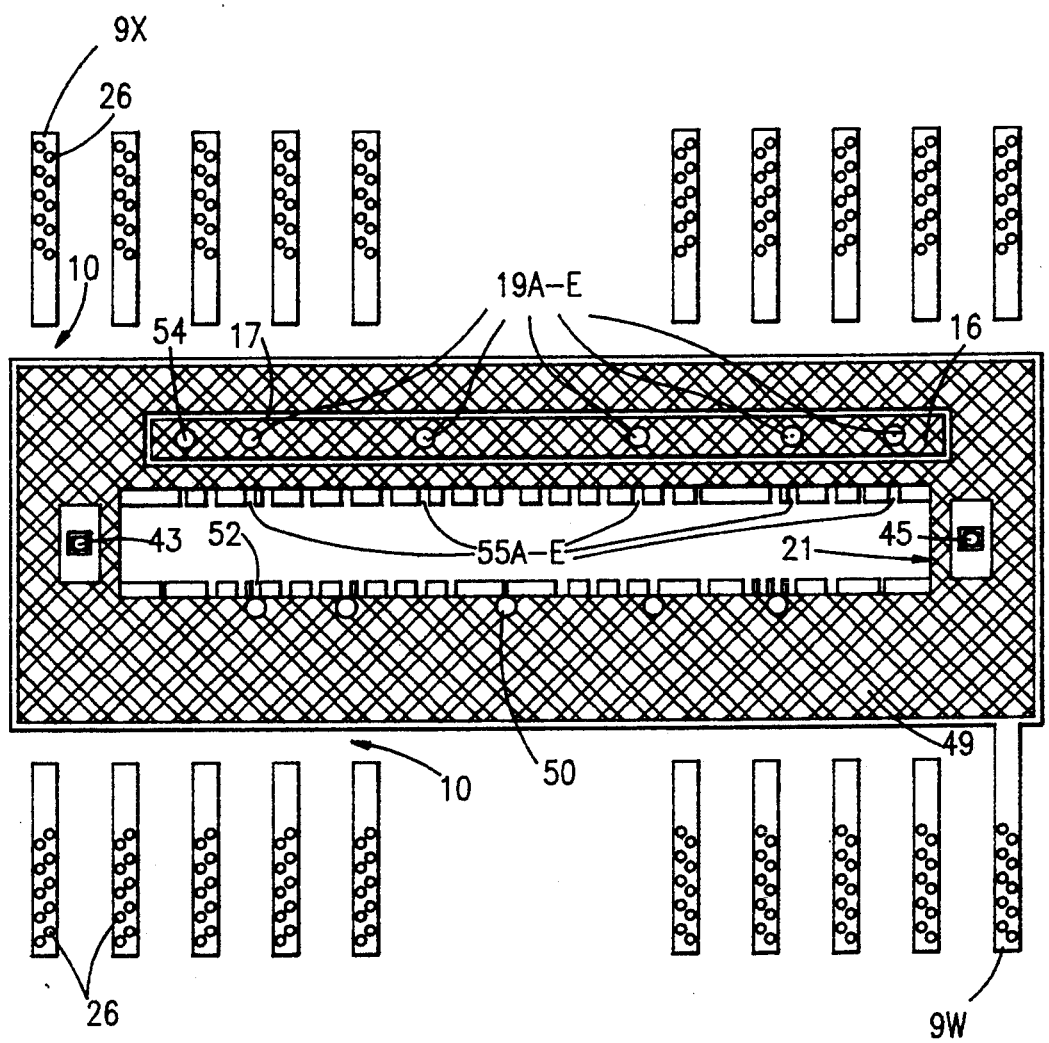
FIG. 7 is a schematic representation of the ground and power distribution in the broad metal layer of the multilayer wiring member in one embodiment of the invention.

In FIGS. 6 and 7, the interrelationship in the multilayer wiring member 5 of the conductor layer 8 and the broad area mesh layer 6 is illustrated using the same reference numerals for like elements as in the earlier Figures. FIG. 6 is an example signal wiring pattern formed from the metal layer 8. FIG. 7 is an example mesh ground plane with embedded power bus pattern. In the embodiment being illustrated, the pattern of FIG. 7 would be superimposed over the pattern of FIG. 6 and separated by a core dielectric layer 7, not shown in these Figures. In superimposition, the registration mark 43 of FIG. 7 would be positioned over registration mark 44 of FIG. 6 and registration mark 45 of FIG. 7 would be positioned over registration mark 46 of FIG. 6. The outline of the chip 2 is the rectangular element 47. In the exposed area of the face 3 of the chip, the pad pattern is within the area 48. In the assignment of the wiring in the overall package, the upper and lower portions, where desired, may be separated by providing open areas 10 in the layer 8 severing selected external contacts 9 from the ground plane. Most external connections 9 have a lower portion in FIG. 6 initially connected to the wiring pattern in FIG. 16 and superimposed thereover an upper portion in FIG. 7 separated from the broad area mesh layer 6 and with holes 26 therethrough as shown in FIGS. 2, 3A and 3B. The ground external contact 9W in FIG. 7 is superimposed on the lower portion 9W' in FIG. 6 and, in use, the two would be electrically connected by solder through holes 26 described in FIGS. 2, 3A and 3B and to be later described in detail in connection with FIGS. 9–22. The upper portion 9W is connected in FIG. 7 to the ground plane mesh 49 and the lower portion 9W' has no connection formed in metal layer 8 in FIG. 6. The ground path is completed through a via such as 50 to a location such as 51 of the type shown in FIGS. 1, 4 and 5 where a bond is then made to a pad in the chip area 48 of FIG. 6 assigned to carry ground to the chip. In the manner illustrated in FIGS. 4 and 5, the mesh 49 and the underlaying dielectric 7 are cut away at locations such as 52 in FIG. 7 to permit and protect the bond made at the lower layer level at locations such as 51 in FIG. 6. In the power distribution, the external connection upper portion 9X and the lower portion 9X' are connected together with solder through holes 26 when the package is connected to the external circuitry. In FIG. 7, the upper portion 9X is separated at area 10 from connection to the ground mesh 49. In FIG. 6, a heavy current carrying conductor 53 connects the lower portion 9X' of the external contact to a via location 54 which is connected as shown in FIG. 7 by a via corresponding to via 18 through the dielectric core layer 7, both not visible in these Figures, to the power bus 16 embedded in the broad area mesh 49 and separated therefrom by separation 17. The power from bus 16 is distributed with vias such as elements 19A–E through the dielectric core layer 7, not visible in these Figures, to FIG. 6 at locations 19A'-E' which, in turn, connect to locations from which bonds can be made to adjacent power receiving pads in the area 48 of the chip in the manner illustrated in connection with FIGS. 4 and 5 with the mesh 49 and the dielectric 7 cut away at locations 55A-E.

In FIG. 6, the signal conductors travel short paths to their respective bonds to the chip, all within a uniform distance through the dielectric core layer 7, not visible in these Figures, to the ground plane mesh 49 in FIG. 7.

In manufacture, the opening in the multilayer wiring member bounded by edge 21 in FIG. 7 and the surface of the chip in which the pad pattern area 48 in FIG. 6 is located, and including the bond cutouts 52 and 55A-E, is filled to the surface of the mesh 49 in FIG. 7 with bond protecting encapsulant not visible in these Figures but shown in FIGS. 1 and 4 as element 22.

Figure 8:
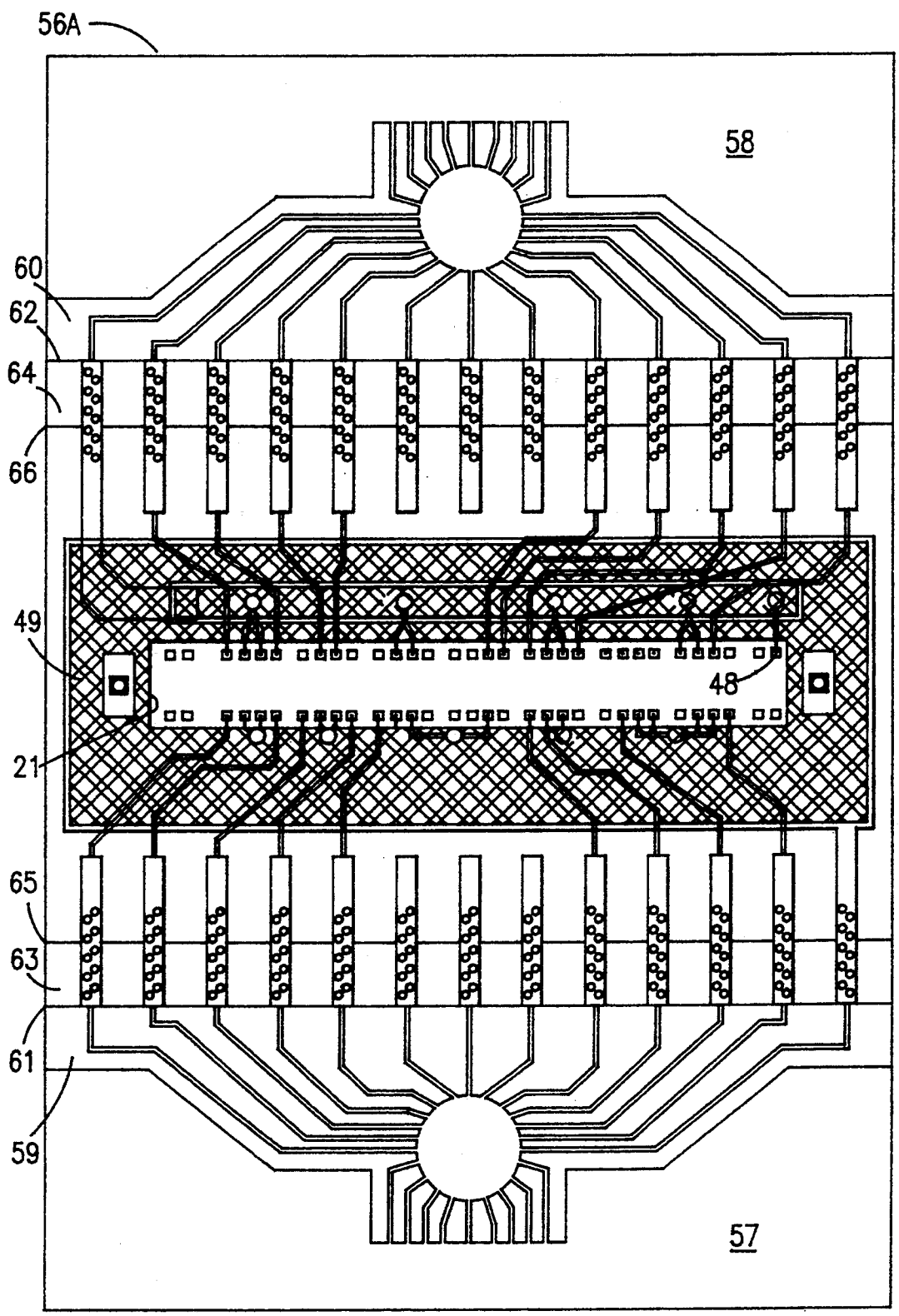
FIG. 8 is a superimposed schematic illustration of both sides of an intermediate manufacturing dielectric tape having the conductor patterns and terminations of the multilayer wiring member of the invention thereon.

Referring next to FIG. 8, a schematic illustration is provided of an intermediate manufacturing product, a dielectric tape, having the conductor patterns and terminations superimposed and with manufacturing facilitating portions that are removed after use. In FIG. 8, for illustration simplicity, the wiring is shown solid under the mesh layer 49.

In manufacturing the mesh patterns are fabricated with the same processes as the wiring pattern.

On the periphery of each side of the edges A and B of the tape 56 carrying a multilayer wiring member, plating terminals 57 and 58 are provided with conductors to all external connections, wiring and broad mesh portions for build up plating and/or final capping metallurgy. The terminals 57 and 58 can later be punched out to permit testing of the chip and package before severing.

The tape section 56A,B in the schematic of FIG. 8 has been positioned in contact with and surrounding the chip pad pattern section 48 of the chip, and the bonds from the wiring conductors to the pads are in place. The opening bounded by the edge 21 is ready for filling with the bond protecting encapsulation 22 described in FIGS. 1 and 4. The covering portion 23, described in connection with FIGS. 1, 3A, 3B and 4, is applied over the mesh metal to the edges of the external contacts adjacent to the mesh metal, usually by injection molding.

Prior to the next level of assembly, sections 59 and 60 extending to lines 61 and 62, respectively, are removed. Prior to that removal, the regions 63 and 64 which separate the external connection portions have also been removed to lines 65 and 66, respectively, usually by erosion of the dielectric 7. It should be noted that the dielectric 7 performs a tying function in retaining the shape and spacing of the external connections as they are being formed.

As the package becomes more dense due to wider temperature cycling, the stress on the external contacts 9 becomes greater. Improved reliability both in making connections and in withstanding temperature cycles in service is achieved by providing one or a plurality of holes 26 as illustrated in all external contacts and in detail in FIGS. 2, 3A and 3B. The holes permit the low temperature fusing metal, such as solder, in the connection to flow through the holes and overlap forming a mechanically reinforced fused connection.

Figure 9:
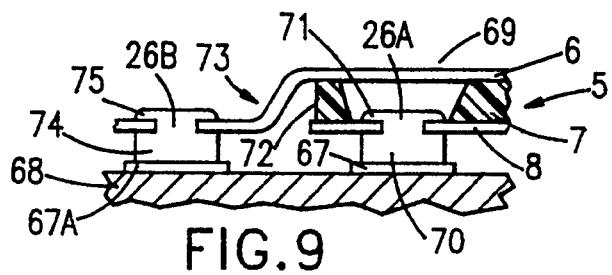
FIG. 9 is a schematic representation of separate connections made to more than one layer of the multilayer wiring member of the invention.
Figure 10:
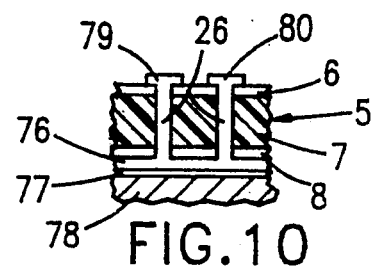
FIG. 10 is a schematic representation of metal flow through holes through the external connection portion of the multilayer wiring member.

In FIGS. 9 and 10, schematic representations are shown of external connections where the solder flows through the hole 26 and overlaps. The same reference numerals for like elements are used as in earlier Figures.

In FIG. 9, connections between separate pads 67 and 67A in an external wiring substrate 68 and the separate metal layers 6 and 8 serving as conductors of the multilayer wiring member 5. At pad 67 an opening 69 is made in the layer 6 to permit the solder for that contact 70 to flow through hole 26A in layer 8 and form a rivet head shaped overlap 71 without shorting to layer 6. Layer 8 is terminated beyond pad 67 a distance to keep a support portion 72 of the core dielectric layer 7. The layer 6 extends at least to pad 67A, bending to the level of layer 8 at region 73 beyond the end of layer 8. At pad 67A the solder 74 flows, when the contact is fused, through the hole 26B and forms the rivet head overlap 75.

In FIG. 10, the solder flow through multiple holes 26 in an external contact 9 is shown. In the contact solder 76 on the pad 77 of the external wiring member 78 flows through the holes 26 and overlaps the layer 6 in the form of rivet heads 79 and 80. In this instance, the solder flow can be facilitated with a metal portion that provides a wicking action as described in FIGS. 17-22.

In forming external contacts to the multilayer wiring member 5, increased reliability and increased service life during wide temperature cycles, while permitting relaxed specifications on temperature and fusing metal composition, is achieved by removal of the core dielectric 7 from the region of the external contacts 9 and replacing it with a metal, usually solder.

Figure 11:
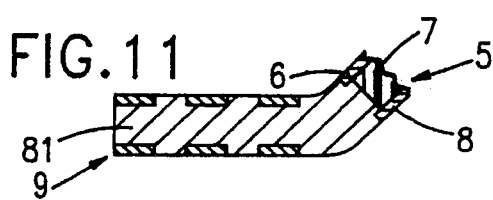
FIG. 11 is a schematic representation of a cross section of an external connecting portion of the multilayer wiring member of the invention wherein the dielectric core element between the wiring layer and the broad metal layer has been removed and replaced with connecting metal.
Figure 12:
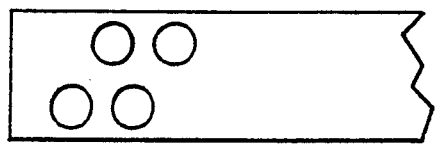
FIGS. 12 to 16 are schematic representations of hole configurations through the multilayer wiring member employable in removing the dielectric core element material in the area.
Figure 13:
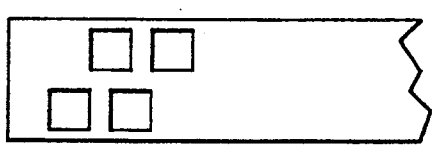
Figure 14:
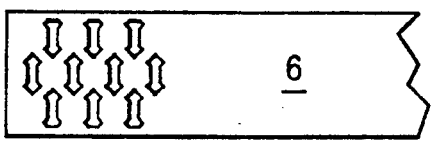
Figure 15:
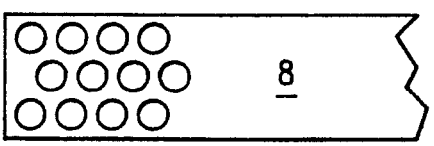
Figure 16:
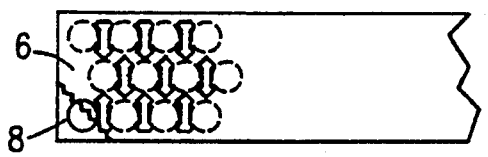

In FIG. 11, a schematic representation of a cross section of the contacting portion of the external contact 9 where the core dielectric layer 7 has been removed at the contact area and has been replaced with solder 81. The removal of the core dielectric layer 7 is accomplished by dissolving the dielectric layer 7 material using an etchant for the material which, for a polyimide material, an etchant such as hot caustic would be satisfactory. It is, however, necessary that enough of the metal layers 6 and 8 be removed so that the dielectric can be etched in a reasonable time. In FIGS. 12 and 13, offset opening patterns through the layers 6 and 8 are illustrated to enhance the ability to get etchant to the dielectric 7. In FIGS. 14, 15 and 16, a different set of superimposable offset opening patterns in the layers 6 and 8 are illustrated. In FIG. 14, a first set in the layer 6 is illustrated exposing a portion of the layer 7. In FIG. 15, a series of staggered rows of circular openings are provided in the layer 8. In FIG. 16, the combined superimposed patterns provide extended exposure of the dielectric 7 to the etchant and ease the flow of the solder 81 in a subsequent step in replacing the layer 7 in the contact area. The openings can be made by pattern plating or pattern etching of the metal layers 6 and 8.

Figure 17:
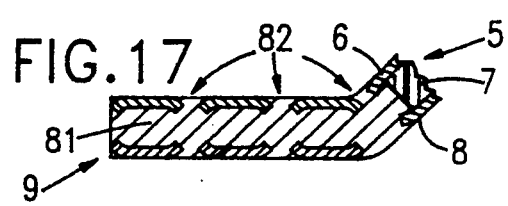
FIG. 17 is a schematic representation of a cross section of an external connecting portion of the multilayer wiring member of the invention wherein the dielectric core element between the wiring layer and the broad metal layer has been removed, and the edges of the holes have been displaced for promotion of a wicking action of the connecting metal.

In FIG. 17, a schematic representation of a cross section of the contact portion of the external contact 9 is shown where the core dielectric layer 7 of the multilayer wiring member 5 has been removed and replaced with solder 81. In FIG. 17, the segments of the layers 6 and 8 are bent toward each other at 82 to enhance a wicking or capillary action of the solder 81 as it fills the holes in the dielectric layer 7. The bending of the segments is achieved by providing openings with tabs extending into the openings in the layers 6 and 8 and deforming the tabs to extend into the region cleared of the dielectric layer 7. This can be accomplished by pressing between elastomeric sheets.

Figure 18:
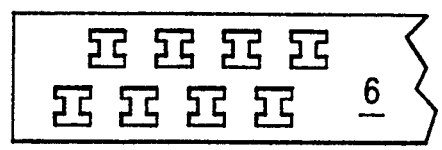
FIGS. 18 to 22 are schematic representations of hole configurations through the multilayer wiring member to promote wicking action of a connecting metal in filling the dielectric core material space.

In FIG. 18, an H shaped opening pattern is illustrated on layer 6 that provides the beginning of the tabs.

Figure 19:
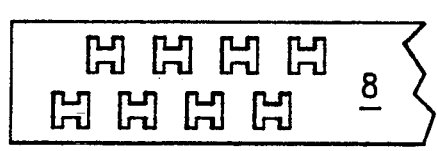

In FIG. 19, in a second step, the H pattern is rotated 90° on layer 8.

Figure 20:
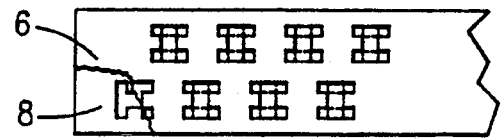

In FIG. 20, the superimposed patterns provide the combined openings with tabs for capillary or wicking action.

In the alternative, the pattern of either FIG. 18 or FIG. 19 could be on both layers 6 and 8 which would produce the pattern of the cross section in FIG. 17.

Figure 21:
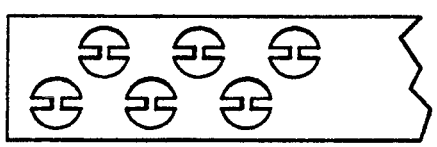
Figure 22:
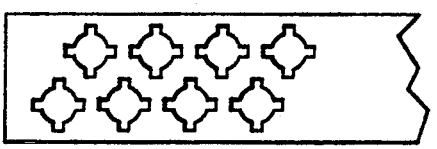

FIGS. 21 and 22 illustrate different rotatable and superimposable opening patterns for providing segments with tabs in the openings. The openings in the metal, such as copper, may be formed by pattern plating or pattern etching, the opening in the dielectric is formed by erosion and the deformation of the tabs on one layer toward the other by a peening operation.

The semiconductor chip packaging technology of the invention can provide substantial benefits in supporting and providing electrical access to the type of chip having about 90 micron on a side electrical contact pads, in an area in the center of the chip which is about 0.20 inches thick.

In order to provide a starting place for one skilled in the art in practicing the invention, the following specifications are advanced.

The base can be of an epoxy plastic material with about 0.005 inches of epoxy under the chip. The multilayer wiring member has as a central layer Kapton TM - DuPont or Upilex TM polyimide about 25–75 microns thick on which copper is sputter seeded; the conductors, the mesh and the external contacts are patterned and then Cu is plated with a Ni/Au covering. The Cu is plated to a thickness of 10–50 microns with a Ni/Au clover of 25 to 50 microinches on each side of the central polyimide. The signal conductors are about 20 to 75 microns wide. The mesh openings are approximately square, about 40 microns on a side. The bonds between the conductors on the multilayer wiring member and the pads on the chip are about 18–25 micron diameter wire. The protective encapsulation over the bonds is of epoxy plastic material. The external contacts in the contact region are about 0.004 to 0.006 inches thick, lead spacings and widths are comparable in dimensions. The cover material can be of epoxy with about 0.005 inches of material above the chip. The adhesive that fastens the chip to the multilayer wiring member can be a thermoplastic, as an example Siltem TM 3M approximately 10 to 50 microns thick.

It is to be understood that the above described embodiments are simply illustrative and that those skilled in the art in the light of the principles set forth may devise modifications and changes that are within the scope and spirit of the invention.

Having thus described our invention, what we claim as new and desire to secure by Letters Patent is:

1. A semiconductor packaging structure comprising in combination:
   a semiconductor chip having a contact pad region in a surface thereof,
      said surface of said chip terminating in at least one edge,
   a multilayer wiring member, said multilayer wiring member having,
      at least one superimposed combination of layers of a conductor layer and a broad area metal layer,
         said broad area metal layer having at least a portion thereof being a metal mesh,
      each said conductor layer and said broad area metal layer combination being separated by a dielectric layer,
   said multilayer wiring member being positioned with a conductor layer of one said at least one combination of said superimposed said conductor layer and said broad area metal layer adjacent said chip surface,
   said multilayer wiring member having at least one external contact member portion,
      said at least one external contact member portion extending beyond said edge of said chip,
   at least one bond joining a conductor on said conductor layer with an adjacent pad in said contact pad region in said surface of said chip,
      at least one said bond being surrounded by a quantity of bond protecting encapsulation,
   said metal mesh portion of said at least one broad area metal layer including a surrounded area of mesh metal electrically separated from the remainder of said metal mesh area portion, and,
   a covering of encapsulating material extending over said at least one bond and said multilayer wiring member leaving exposed each said at least one external contact member portion of said multilayer wiring member.

2. The structure of claim 1 wherein said surrounded area of mesh metal is connected to at least one conductor on said conductor layer by at least one via element.

3. The structure of claim 2 wherein said at least one external contact member portion of said multilayer wiring member includes a plurality of said external contact member portions along each said at least one edge of said semiconductor chip with said broad metal layer having a separation separating at least one of said plurality of said external contact member portions from said area of mesh metal portion of said broad metal layer.

4. The structure of claim 3 wherein each said external contact member portion of said multilayer wiring member has at least one hole through the conductor layer, the dielectric layer and the broad metal layer thereof.

5. The structure of claim 3 wherein in each said external contact member portion of said conductor layer and said broad metal layer are joined by metal.

6. A semiconductor packaging structure comprising in combination:
   a base of encapsulating material having at least one edge and a surface,
   a semiconductor chip having a contact pad region in a surface thereof,
      said semiconductor chip being embedded in said base with said contact pad region essentially flush with said surface of said base,
   a multilayer wiring member, said multilayer wiring member having superimposed layers of
      at least one conductor layer and
      a broad area metal layer said broad area metal layer having included therein a portion of said area of metal mesh,
      said broad area metal layer having further included therein a surrounded area of metal mesh electrically separated from said mesh portion,
   said multilayer wiring member being positioned with one said conductor layer adjacent said chip surface,
   said multilayer wiring member having at least one external contact member portion,
      said at least one external contact member portion extending beyond said edge of said base, at least one bond joining a conductor on said conductor layer with an adjacent pad in said contact pad region in said surface of said chip, at least one said bond being surrounded with bond protecting encapsulation, and, a covering of encapsulating material extending over said at least one bond and said multilayer wiring member leaving exposed each said at least one external contact member portion of said multilayer wiring member.

7. The structure of claim 6 wherein said surrounded area of mesh metal is connected to at least one conductor on said conductor layer by at least one via element.

8. The structure of claim 7 wherein said at least one external contact member portion of said multilayer wiring member includes a plurality of said external contact member portions along each said at least one edge of said base with said broad metal layer having a separation separating at least one of said plurality of said external contact member portions from said area of mesh metal portion of said broad metal layer.

9. The structure of claim 8 wherein each said external contact member portion of said multilayer wiring member has at least one hole through the conductor layer, the dielectric layer and the broad metal layers thereof.

10. The structure of claim 8 wherein in each said external contact member portion said conductor layer and said broad metal layer are joined by metal.

11. A multilayer wiring structure comprising in combination an area of superimposed layers of at least one layer of metal wiring conductors and at least one broad metal layer having at least a portion thereof a mesh of metal conductors and open areas, each said metal wiring conductor layer and said broad metal layer being separated by a layer of dielectric, and, in said mesh portion of said broad metal layer, there is a surrounded area of mesh metal electrically separated from the remainder of said mesh metal portion.

12. The wiring structure of claim 11 including at least one external contact portion extending from said area.

13. The wiring structure of claim 12 wherein each said external contact portion has at least one hole through said layer of wiring conductor metal, said layer of dielectric and said broad metal layer.

14. In a semiconductor chip wiring package wherein electrical interconnection between external wiring locations and connections to pads in an area of a surface of a chip are through conductors supported by dielectric, the improvement comprising:

a multilayer wiring member, said multilayer wiring member having superimposed layers of wiring conductor metal and broad area metal separated by a layer of dielectric, said multilayer wiring member having an area opening corresponding to said area of said pads in said surface of said chip, said multilayer wiring member being positioned with said wiring conductor metal layer adjacent said chip and with said pad area of said chip surrounded by said opening, at least one bond providing electrical connection from at least one pad in said pad area in said surface of said chip to at least one wiring conductor in said wiring conductor metal layer, and, at least one external conductor portion of said superimposed layers each extending to an external wiring location.

15. The package of claim 14 wherein said opening is filled with bond protecting encapsulant.

16. The package of claim 14 including, in said broad area metal layer, a surrounded area of metal electrically separated from said broad area metal layer.

17. The package of claim 14 including a separation region in said broad area metal layer adapted to electrically separate at least one selected external conductor portion of said superimposed layers from said broad area metal layer.

18. The package of claim 14 including at least one via connection through said dielectric layer electrically interconnecting a conductor in said wiring conductor metal layer with at least one of said broad area metal layer and said surrounded area of metal.

* * * * *